United States Patent
Gu et al.

(10) Patent No.: US 9,368,716 B2
(45) Date of Patent: Jun. 14, 2016

(54) MAGNETIC TUNNEL JUNCTION (MTJ) STORAGE ELEMENT AND SPIN TRANSFER TORQUE MAGNETORESISTIVE RANDOM ACCESS MEMORY (STT-MRAM) CELLS HAVING AN MTJ

(75) Inventors: Shiqun Gu, San Diego, CA (US); Seung H. Kang, San Diego, CA (US); Xiaochun Zhu, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 875 days.

(21) Appl. No.: 12/363,886

(22) Filed: Feb. 2, 2009

(65) Prior Publication Data

US 2010/0193888 A1 Aug. 5, 2010

(51) Int. Cl.
| H01L 27/22 | (2006.01) |
| H01L 43/12 | (2006.01) |
| H01L 29/82 | (2006.01) |
| H01L 27/24 | (2006.01) |
| H01L 43/08 | (2006.01) |

(52) U.S. Cl.
CPC .............. *H01L 43/12* (2013.01); *H01L 27/222* (2013.01); *H01L 27/24* (2013.01); *H01L 29/82* (2013.01); *H01L 43/08* (2013.01); *H01L 27/228* (2013.01)

(58) Field of Classification Search
CPC ........ H01L 27/222; H01L 29/82; H01L 27/24
See application file for complete search history.

(56) References Cited

U.S. PATENT DOCUMENTS

| 6,737,283 | B2 | 5/2004 | Morgan |
| 6,815,248 | B2 * | 11/2004 | Leuschner et al. ............ 438/59 |
| 6,881,351 | B2 * | 4/2005 | Grynkewich et al. ........... 216/22 |
| 6,903,396 | B2 * | 6/2005 | Tuttle .................... B82Y 25/00 257/295 |
| 7,315,071 | B2 | 1/2008 | Boivin |
| 2002/0172073 | A1 | 11/2002 | Hidaka |
| 2004/0012056 | A1 | 1/2004 | Nejad et al. |
| 2004/0041181 | A1 | 3/2004 | Morgan |

(Continued)

FOREIGN PATENT DOCUMENTS

| JP | 2001168418 A | 6/2001 |
| JP | 2002305290 A | 10/2002 |

(Continued)

OTHER PUBLICATIONS

International Search Report—PCT/US2010/022887, International Search Authority—European Patent Office Apr. 28, 2010.

(Continued)

*Primary Examiner* — Bac Au
(74) *Attorney, Agent, or Firm* — Donald D. Min; Paul Holdaway (57) ABSTRACT

A magnetic tunnel junction storage element for a spin transfer torque magnetoresistive random access memory (STT-MRAM) bit cell includes a bottom electrode layer, a pinned layer adjacent to the bottom electrode layer, a dielectric layer encapsulating a portion of the bottom electrode layer and the pinned layer, the dielectric layer including sidewalls that define a hole adjacent to a portion of the pinned layer, a tunneling barrier adjacent to the pinned layer, a free layer adjacent to the tunneling barrier, and a top electrode adjacent to the free layer, wherein a width of the bottom electrode layer and/or the pinned barrier in a first direction is greater than a width of a contact area between the pinned layer and the tunneling barrier in the first direction. Also a method of forming an STT-MRAM bit cell.

17 Claims, 13 Drawing Sheets

(56) References Cited

U.S. PATENT DOCUMENTS

| | | |
|---|---|---|
| 2004/0137681 A1 | 7/2004 | Motoyoshi |
| 2004/0174740 A1 | 9/2004 | Lee et al. |
| 2004/0233760 A1 | 11/2004 | Guo et al. |
| 2006/0145198 A1 | 7/2006 | Boivin |
| 2007/0297220 A1 | 12/2007 | Yoshikawa et al. |
| 2008/0179699 A1 | 7/2008 | Horng et al. |

FOREIGN PATENT DOCUMENTS

| | | |
|---|---|---|
| JP | 2003017665 A | 1/2003 |
| JP | 2003332650 A | 11/2003 |
| JP | 2005322760 A | 11/2005 |
| JP | 2006179524 A | 7/2006 |
| JP | 2007012696 A | 1/2007 |
| JP | 2008192693 A | 8/2008 |
| JP | 2008277542 A | 11/2008 |
| JP | 2009224477 A | 10/2009 |
| KR | 20040078883 A | 9/2004 |
| KR | 20060072865 A | 6/2006 |
| KR | 100727710 B1 | 6/2007 |

OTHER PUBLICATIONS

Written Opinion—PCT/US2010/022887, International Search Authority—European Patent Office Apr. 28, 2.

* cited by examiner

CONVENTIONAL ART
FIG. 1

CONVENTIONAL ART

CONVENTIONAL ART

MAGNETIC TUNNEL JUNCTION (MTJ) STORAGE ELEMENT AND SPIN TRANSFER TORQUE MAGNETORESISTIVE RANDOM ACCESS MEMORY (STT-MRAM) CELLS HAVING AN MTJ

FIELD OF DISCLOSURE

Disclosed embodiments are related to a Spin Transfer Torque Magnetoresistive Random Access Memory (STT-MRAM) cell, and to methods of forming same. More particularly, exemplary embodiments are directed to a magnetic tunnel junction (MTJ) storage element usable in an STT-MRAM cell and to methods of forming same.

BACKGROUND

Magnetoresistive Random Access Memory (MRAM) is a non-volatile memory technology that uses magnetic elements. For example, Spin Transfer Torque Magnetoresistive Random Access Memory (STT-MRAM) uses electrons that become spin-polarized as the electrons pass through a thin film (spin filter). STT-MRAM is also known as Spin Transfer Torque RAM (STT-RAM), Spin Torque Transfer Magnetization Switching RAM (Spin-RAM), and Spin Momentum Transfer (SMT-RAM).

Figure 1:
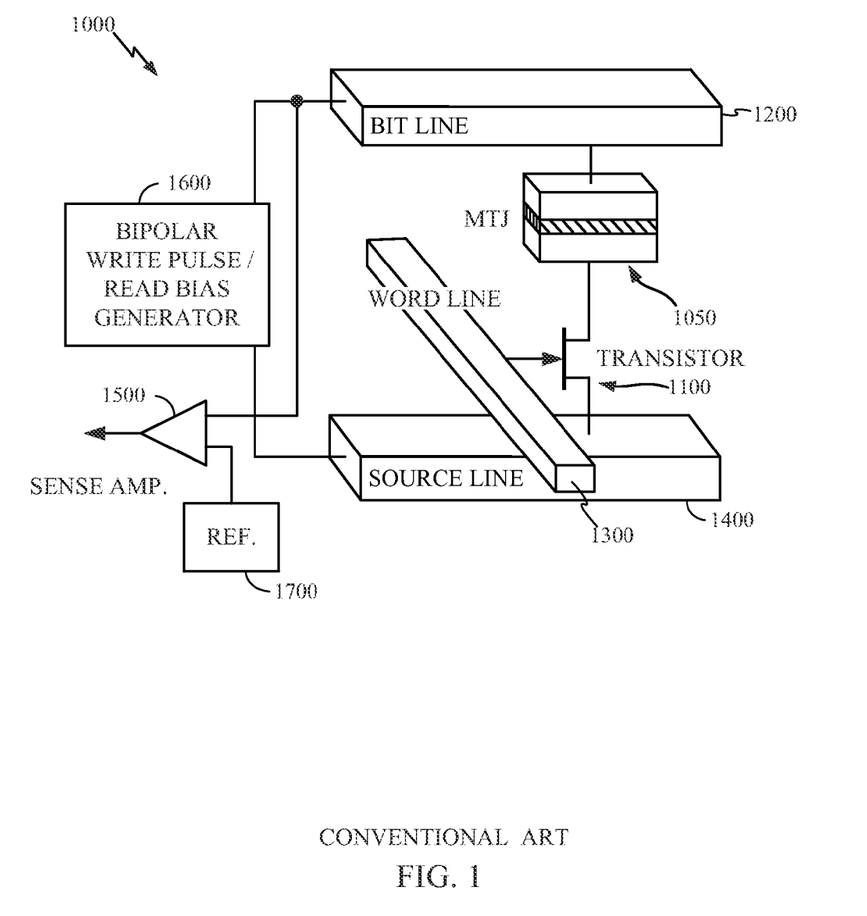
FIG. 1 illustrates a conventional Spin Transfer Torque Magnetoresistive Random Access Memory (STT-MRAM) cell array.

FIG. 1 illustrates a conventional STT-MRAM bit cell 1000. The STT-MRAM bit cell 1000 includes magnetic tunnel junction (MTJ) storage element 1050, a transistor 1100, a bit line 1200 and a word line 1300. The MTJ storage element is formed, for example, from a pinned layer and a free layer, each of which can hold a magnetic field or polarization, separated by an insulating (tunneling barrier) layer as illustrated in FIG. 1. The polarization of the free layer can be reversed so that the polarity of the pinned layer and the free layer are either substantially aligned or opposite. The resistance of the electrical path through the MTJ will vary depending on the alignment of the polarizations of the pinned and free layers. This variance in resistance can be used to program and read the bit cell 1000, as is known. The STT-MRAM bit cell 1000 also includes a source line 1400, a sense amplifier 1500, read/write circuitry 1600 and a bit line reference 1700. Those skilled in the art will appreciate the operation and construction of the memory cell 1000 is known in the art. Additional details concerning such memory cells are provided, for example, in M. Hosomi, et al., "A Novel Nonvolatile Memory with Spin Transfer Torque Magnetoresistive Magnetization Switching: Spin-RAM," *Proceedings of IEDM Conference* (2005), which is incorporated herein by reference in its entirety.

Figure 2:
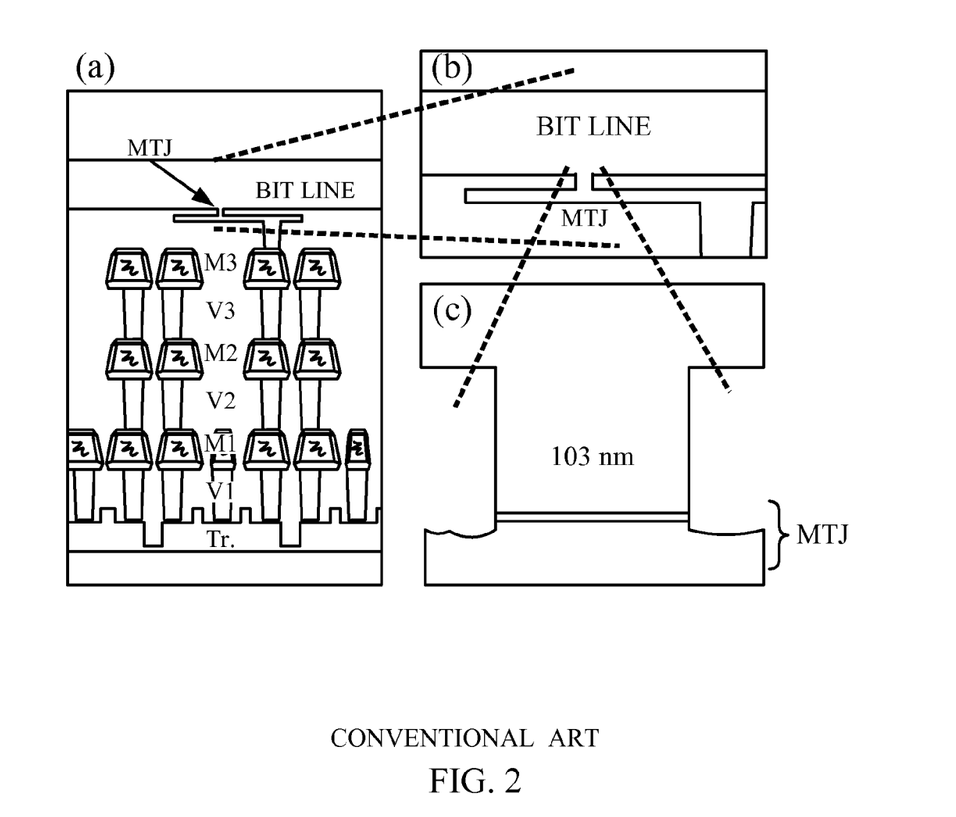
FIG. 2(a) is a cross-sectional view of a conventional STT-MRAM cell.
FIG. 2(b) is an enlargement of a portion of the conventional STT-MRAM cell according to FIG. 2(a).
FIG. 2(c) is an enlargement of the conventional MTJ cell according to FIG. 2(a).

With reference to FIGS. 2(a)-(c), conventional MTJ storage elements generally are formed by first patterning a bottom fixed layer, forming a single damascene, depositing the tunneling barrier/free layer/top electrode stack, and performing a chemical mechanical polishing (CMP) step.

Figure 3:
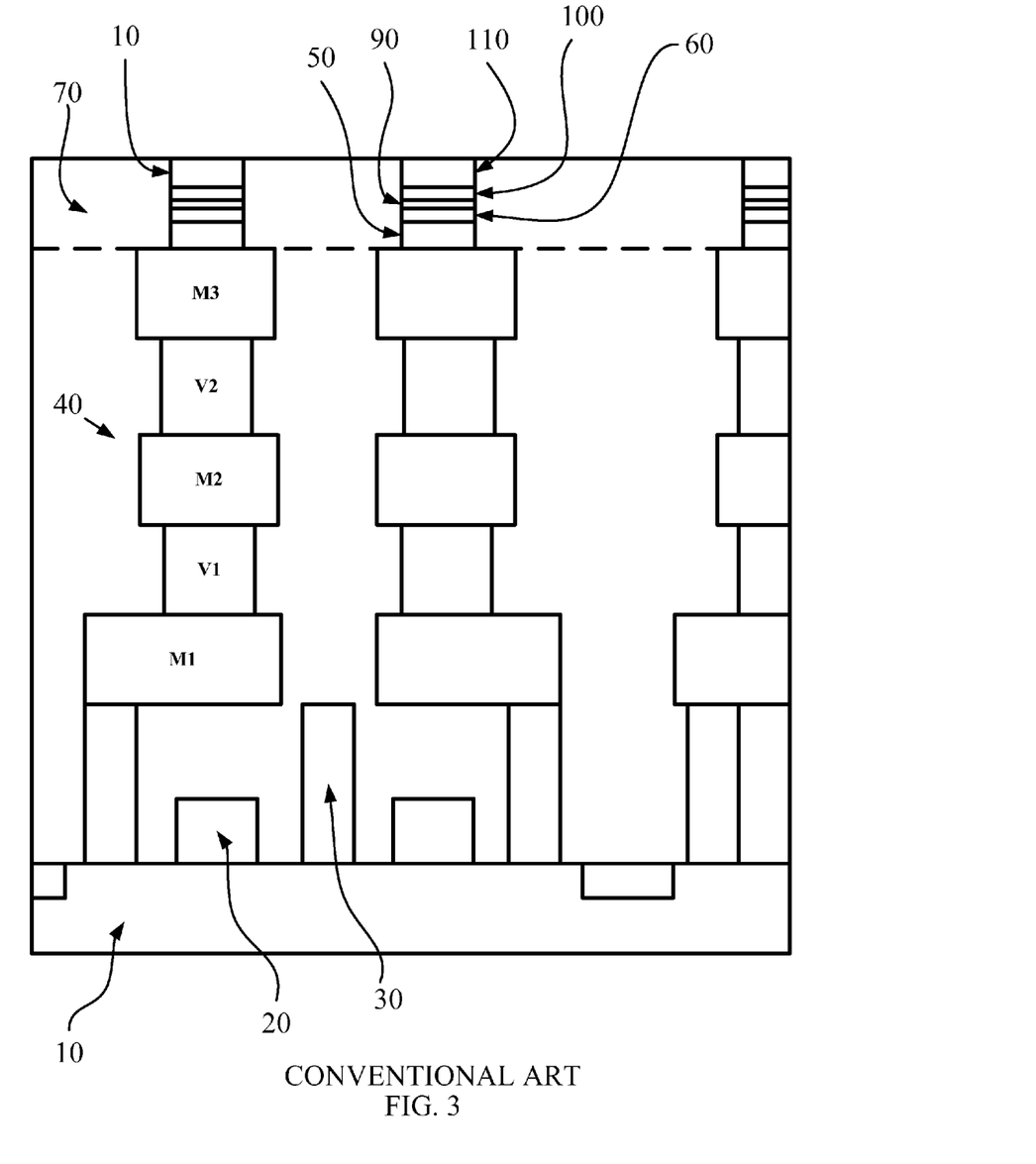
FIG. 3 is a schematic cross-sectional view of a conventional STT-MRAM bit cell.

For example, as shown in FIG. 3, conventional MTJ storage elements generally are formed by depositing an MTJ and hardmask layer stack on the top metal layer (e.g., M3) of a metal stack (e.g., interconnect 40) using physical vapor deposition (PVD). The MTJ and hardmask layer stack commonly includes a bottom electrode layer 50 which may be formed, for example, from tantalum, a pinned layer 60, a tunneling barrier layer 90, a free layer 100, and a hardmask or upper electrode layer 110 which may be formed for example, from Ta/TaN or Ti/TiN.

In the conventional methods, a first step commonly includes depositing the bottom electrode layer 50 (e.g., Ta), the pinned layer 60, the tunneling barrier 90, the free layer 100, and the hardmask layer (Ta/TaN, Ti/TN). The pinned layer 60 may include one or more layers or films (e.g., a pinned layer stack). Next, the MTJ stack is subjected to a magnetic annealing process in a vacuum. A pattern is then applied to the MTJ stack using a lithography technique. The patterned cell size may be larger than the final size. Each of the aforementioned layers can be comprised of one or more layers or films.

Next, the MTJ stack is etched. The etching process includes trimming the resist size and pattern hardmask, stripping the resist, etching the free layer 100, and etching the pinned layer 60 and the bottom electrode layer 50. The MTJ stack is then cleaned. The cleaning process commonly is compatible with low-k and MTJ cleaning. Next, a passivation layer is deposited to protect the MTJ storage element and the inter-layer dielectric 70. A combination stack may be needed, along with a low deposition temperature to protect the MTJ and promote adhesion between the MTJ and ILD. Finally, the MTJ and ILD are polished using a less aggressive chemical mechanical polishing (CMP) to prevent delaminating.

As shown in FIG. 3, the conventional STT-MRAM bit cell formed according to the conventional methods includes a substrate 10, word lines 20, and a contact 30 to $V_{SS}$ (not shown). The bottom electrode layer 50 is formed on the top metal layer of the interconnect 40. The pinned layer 60, the tunneling barrier layer 90, the free layer 100, and the top electrode 110 are formed on the bottom electrode layer 50. The ILD layer 70 is formed over the MTJ cell.

SUMMARY

Exemplary embodiments are directed to a Spin Transfer Torque Magnetoresistive Random Access Memory (STT-MRAM) cell and to methods of forming same. More particularly, embodiments are related to a magnetic tunnel junction (MTJ) storage element of an STT-MRAM cell and to methods of forming same.

For example, an exemplary embodiment is directed to a memory device having a magnetic tunnel junction (MTJ) storage element, the MTJ storage element comprising: a bottom electrode; a pinned layer adjacent to the bottom electrode; a dielectric layer encapsulating a portion of the bottom electrode and the pinned layer, wherein the dielectric layer includes sidewalls that define a hole adjacent to a portion of the pinned layer; a tunneling barrier adjacent to the pinned layer; a free layer adjacent to the tunneling barrier; and a top electrode adjacent to the free layer, wherein a width of the bottom electrode and/or the pinned layer in a first direction is greater than a width of a contact area between the pinned layer and the tunneling barrier in the first direction.

Another exemplary embodiment is directed to a method of forming a memory device having a magnetic tunnel junction (MTJ) storage element, the method comprising: forming a bottom electrode on a substrate; forming a pinned layer on the bottom electrode; depositing a dielectric layer on the bottom electrode and the pinned layer; patterning and etching a hole having a sidewall in the dielectric layer down to the pinned layer; depositing a tunneling barrier layer in a first portion of the hole to create a tunneling barrier on the pinned layer; depositing a free layer in a second portion of the hole such that the free layer is on the tunneling barrier; and depositing a top layer over the free layer.

An exemplary embodiment is directed to a memory device having a magnetic tunnel junction (MTJ) storage element, the MTJ storage element comprising: bottom conductive means for electrically connecting the MTJ storage element; first magnetic means for holding a first polarization, the first magnetic means being adjacent to the bottom conductive means; first insulating means for encapsulating a portion of the bottom conductive means and the first magnetic means, wherein the first insulating means includes sidewalls that define a hole adjacent to a portion of the first magnetic means; second magnetic means for holding a second polarization, wherein the second polarization is reversible; second insulating means for tunneling current flowing between the first magnetic means and the second magnetic means, the second insulating means separating the first magnetic means and the second magnetic means; and top conductive means for electrically connecting the MTJ storage element, the top conductive means being adjacent to the second magnetic means, wherein a width of the bottom conductive means and/or the first magnetic means in a first direction is greater than a width of a contact area between the first magnetic means and the second insulating means in the first direction.

Another exemplary embodiment of comprises a method of forming a memory device having a magnetic tunnel junction (MTJ) storage element, the method comprising: step for forming a bottom electrode on a substrate; step for forming a pinned layer on the bottom electrode; step for depositing a dielectric layer on the bottom electrode and the pinned layer; step for patterning and etching a hole having a sidewall in the dielectric layer down to the pinned layer; step for depositing a tunneling barrier layer in a first portion of the hole to create a tunneling barrier on the pinned layer; step for depositing a free layer in a second portion of the hole such that the free layer is on the tunneling barrier; and step for depositing a top layer over the free layer.

BRIEF DESCRIPTION OF THE DRAWINGS

The accompanying drawings are presented to aid in the description of embodiments and are provided solely for illustration of the embodiments and not limitation thereof.

DETAILED DESCRIPTION

Exemplary aspects of the disclosure are disclosed in the following description and related drawings directed to specific embodiments. Alternate embodiments may be devised without departing from the scope of the invention. Additionally, well-known elements of the embodiments will not be described in detail or will be omitted so as not to obscure the relevant details of the embodiments.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation. The terminology used herein is for the purpose of describing particular embodiments only and is not intended to be limiting of embodiments.

As used herein, the singular forms "a", "an" and "the" are intended to include the plural forms as well, unless the context clearly indicates otherwise. It will be further understood that the terms "comprises", "comprising," "includes" and/or "including", when used herein, specify the presence of stated features, integers, steps, operations, elements, and/or components, but do not preclude the presence or addition of one or more other features, integers, steps, operations, elements, components, and/or groups thereof.

The disclosed embodiments recognize that, with conventional methods, it may be difficult to control etch stop on the bottom electrode of the MTJ. Also, an incomplete clean post etch may leave a polymer residue on the MTJ sidewall, some of which may be conductive and can produce a leakage path, thereby reducing the magnetic resistance (MR) ratio. Moreover, the barrier oxide layer near the MTJ sidewall can be impacted by the process flow (i.e., the ash and clean process), thereby producing a thicker tunneling barrier near the MTJ sidewall. The impact of the thicker tunneling barrier will be pronounced for scaled down features.

The exemplary embodiments beneficially allow the number of masks used in a production process to be reduced. For example, two photo masks can be used instead of three masks. Also, according to the embodiments, a heavy metal etch process is not needed for critical dimensions, such as the interfaces between the pinned layer and the tunneling barrier and the free layer and the tunneling barrier. Further, sidewall polymer stringer induced leakage pass can be reduced or eliminated.

Additionally, according to the embodiments, the tunneling barrier of the MTJ is not exposed to an ash and clean process. Moreover, the embodiments can provide a larger bottom fixed layer as compared with the conventional methods, which can minimize the stray field impact of the bottom fixed layer to the top free layer.

With reference to FIGS. 4-11, exemplary embodiments of a method of forming a Spin Transfer Torque Magnetoresistive Random Access Memory (STT-MRAM) cell, and embodiments of an STT-MRAM cell, will now be described.

Figure 4:
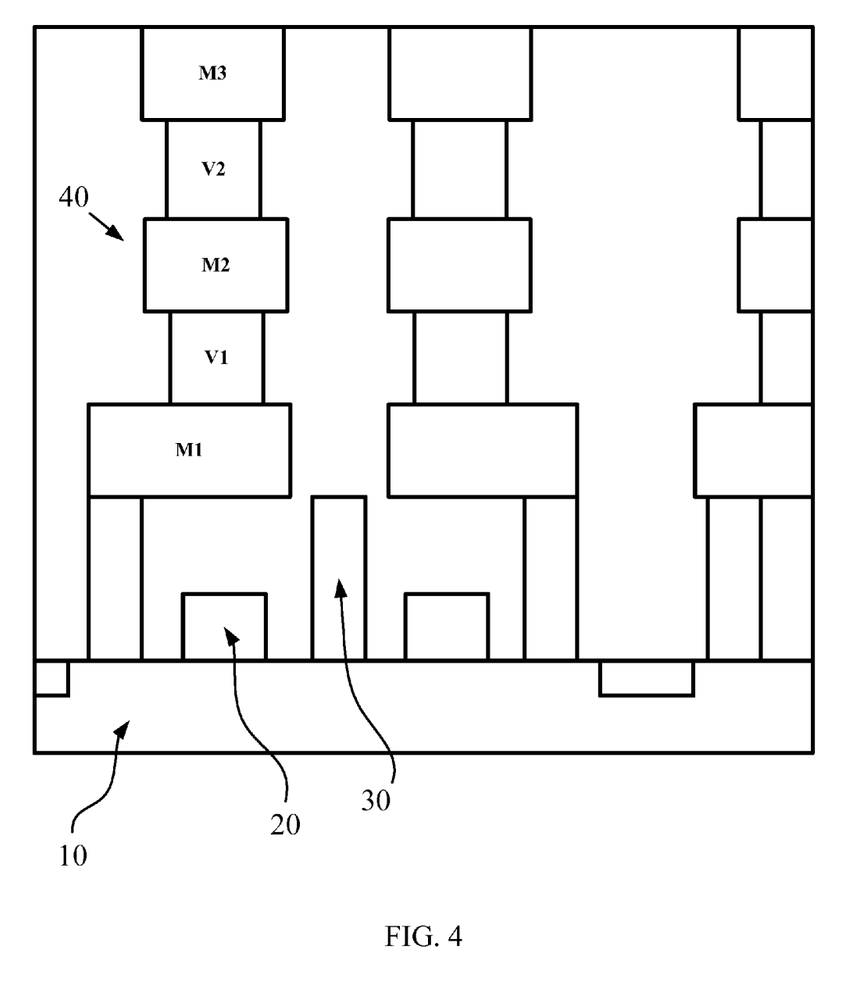
FIG. 4 through FIG. 7 are schematic cross-sectional views of an STT-MRAM bit cell during various stages of manufacture.

FIG. 4 shows a schematic cross-sectional view of a partial STT-MRAM bit cell formed according to an exemplary embodiment. The STT-MRAM bit cell has a substrate 10, word lines 20, contact 30 to Vss (not shown), and an interconnect 40, which includes, for example, metal layers M1, M2, and M3 (e.g., Cu or W) connected to each other in series by via interconnects V1, V2, and V3. A dielectric (e.g., an oxide layer) is filled around the layers of the interconnect 40. The top metal layer M3 of the interconnect 40 is polished, for example, using a chemical mechanical polishing (CMP) technique. One of ordinary skill in the art will recognize that any level of metal layer or via can be polished for forming the MTJ storage element thereon.

Figure 5:
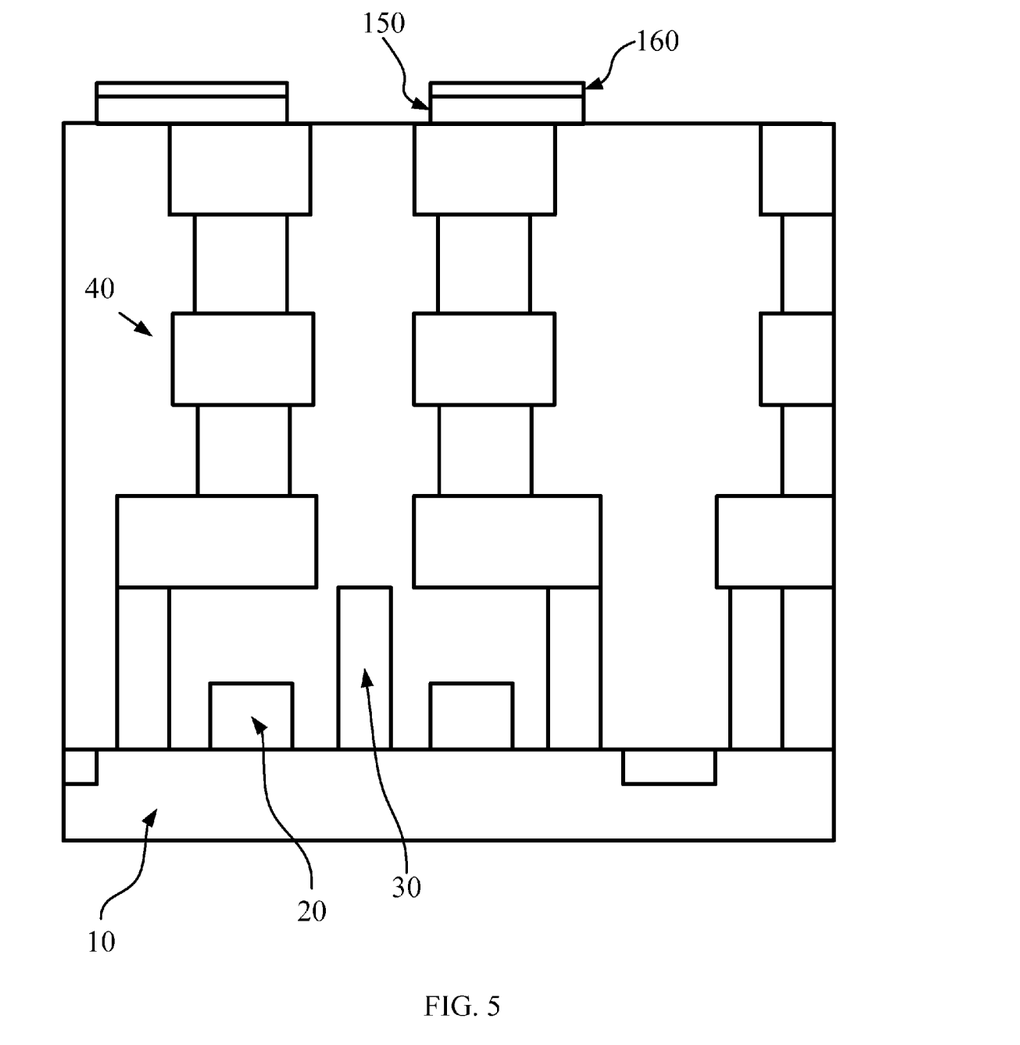

As shown in FIG. 5, of the exemplary embodiment includes forming the MTJ bottom electrodes by depositing a bottom electrode layer 150 (e.g., Ta) and a pinned layer 160, for example, on the polished top metal layer M3 of the interconnect 40. The pinned layer 160 includes a stack of layers (i.e., a plurality of layers). Next, the bottom electrode layer 150 and pinned layer 160 are subjected to a magnetic annealing process in a vacuum. A pattern is then applied to the MTJ electrode using a lithography technique. Next, the bottom electrode layer 150 and pinned layer 160 are etched down to the oxide layer, and then cleaned to form the individual bottom electrodes, as shown in FIG. 5. The bottom electrode layer 150 and pinned layer 160 are illustrated as being offset from the interconnect 40. However, other arrangements can be provided. For example, the bottom electrode layer 150 and the pinned layer 160 can be aligned with the interconnect 40. The sizes of the bottom electrode layer 150, the pinned layer 160, and the interconnect 40 also are not limited to the illustrated arrangement. For example, the size of the bottom electrode layer 150 and pinned layer 160 may be larger, smaller, or the same as the size of the interconnect 40.

According to an exemplary embodiment, the lithography and etching technique is not applied to form any critical dimensions of the MTJ storage element. That is, the interfaces of the tunneling barrier 190 (see, e.g., FIG. 7) to the pinned layer 160 (e.g., see FIG. 5) and the free layer 200 (see, e.g., FIG. 7) are not exposed to any etching or cleaning, thereby avoiding some of the aforementioned problems with the conventional methods.

Figure 6:
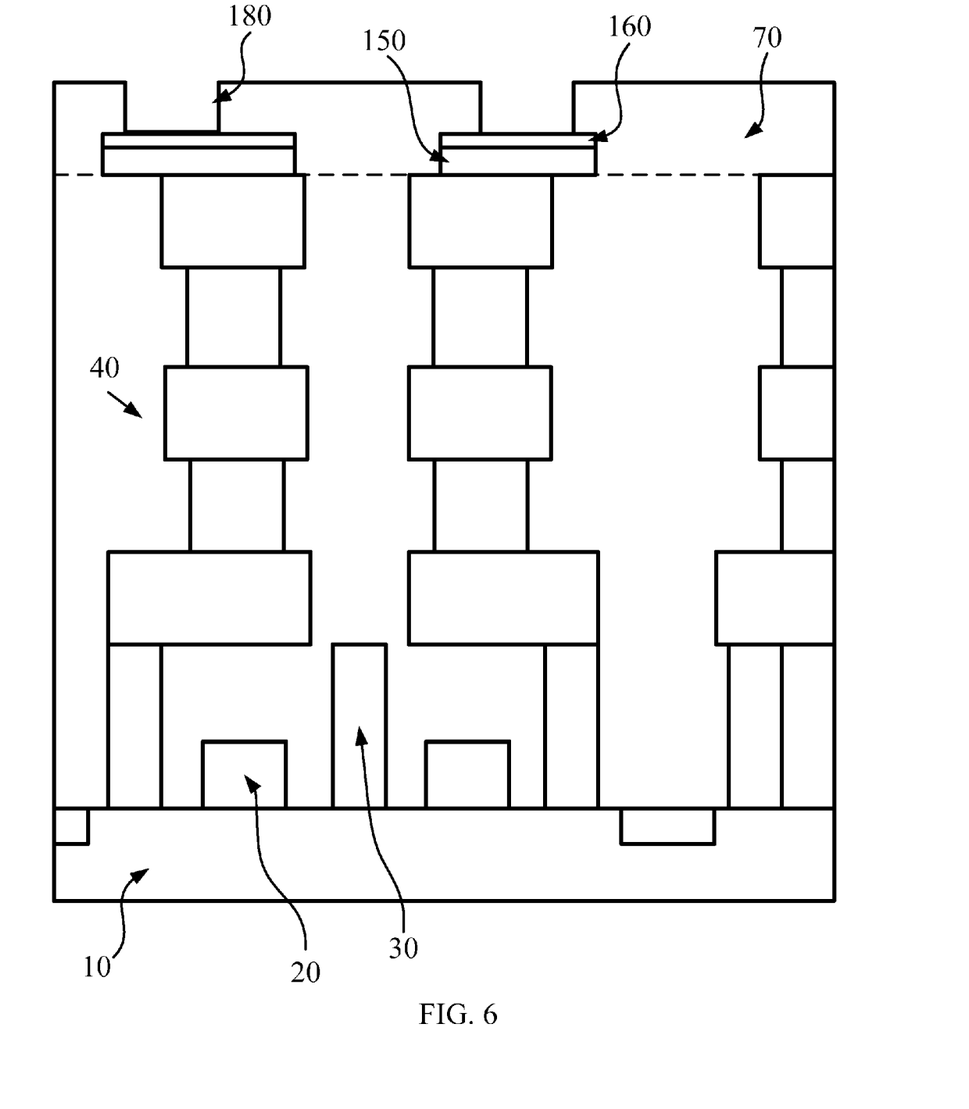
Figure 10:
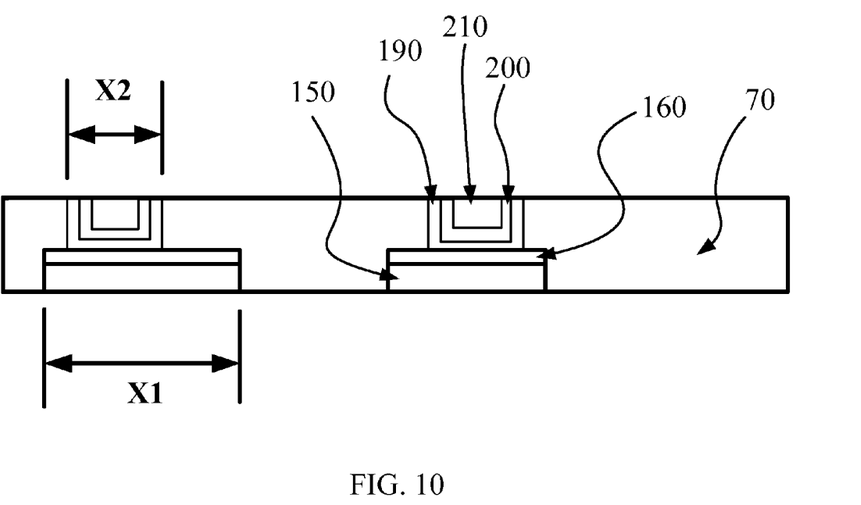
FIG. 10 is a schematic cross-sectional view of an MTJ storage element of an STT-MRAM bit cell.

Next, as shown in FIG. 6, an interlayer dielectric (ILD) 70 is deposited on the bottom electrode layer 150 and pinned layer 160, and a hole 180 is patterned and etched into the ILD 70 down to the pinned layer 160. With reference to FIG. 10, a dimension X1 of the bottom electrode layer 150 and pinned layer 160 can be greater than a dimension X2 of the contact area between the pinned layer 160 and the tunneling barrier 190, which allows for greater tolerance when patterning and etching the hole 180 into the ILD 70. The ILD 70 may be the same as or different from the dielectric filled around the interconnect 40.

Figure 7:
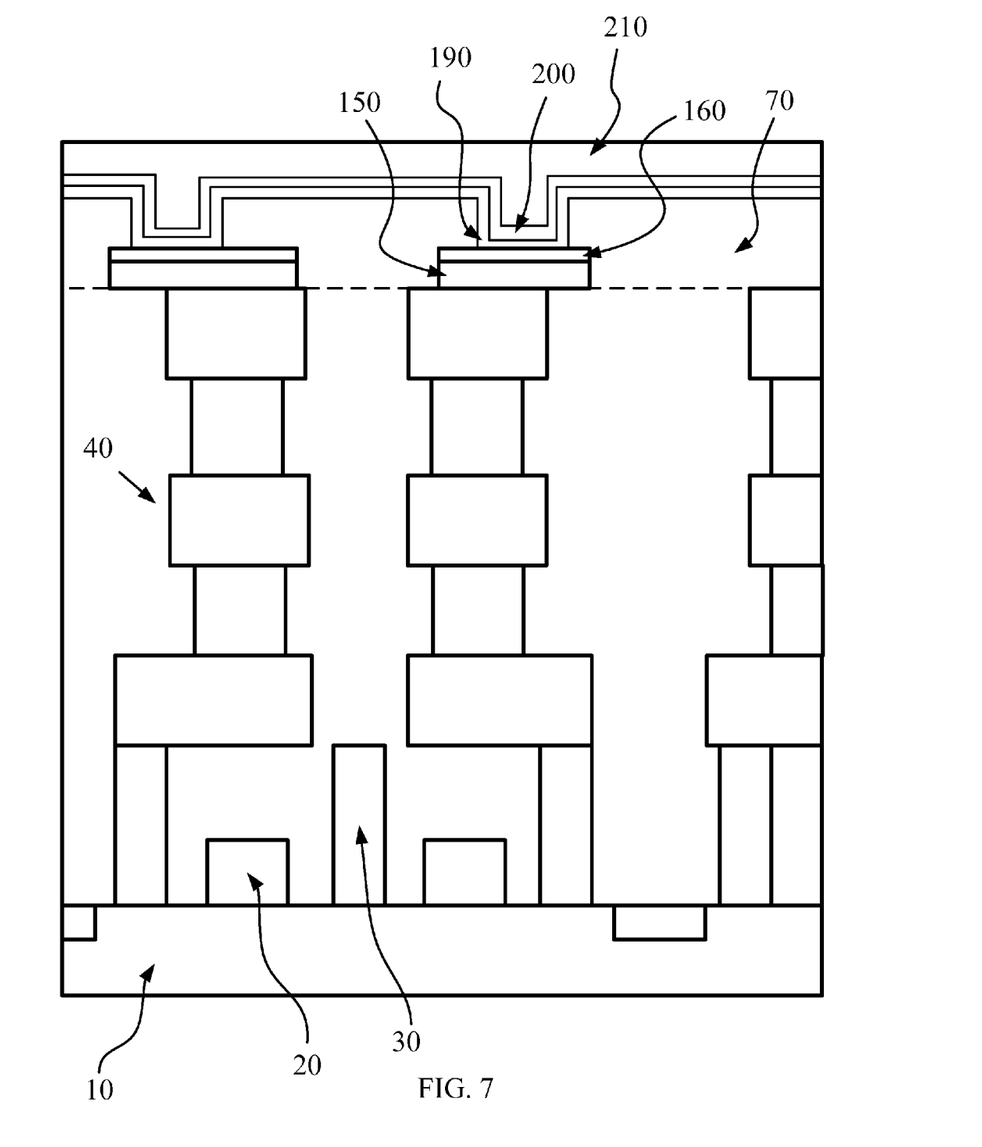

FIG. 7 illustrates forming the tunneling barrier 190, free layer 200, and top electrode 210 over the ILD 70 and hole 180. Particularly, as shown in FIG. 7, the tunneling barrier 190 is formed over the ILD 70 and the hole 180 such that a portion of the tunneling barrier 190 is disposed on the sidewalls of the hole 180 and perpendicular to the bottom electrode (e.g., bottom electrode layer 150 and pinned layer 160). The free layer 200 is then formed over the tunneling barrier 190 such that a portion of the free layer 200 also is perpendicular to the bottom electrode layer 150 and pinned layer 160. The top electrode 210 is formed over at least a portion of the free layer 200 that is disposed in the hole 180, thereby filling at least the remaining portion of the hole 180. As shown in FIG. 7, the top electrode 210 can be formed over the entire free layer 200.

Figure 8:
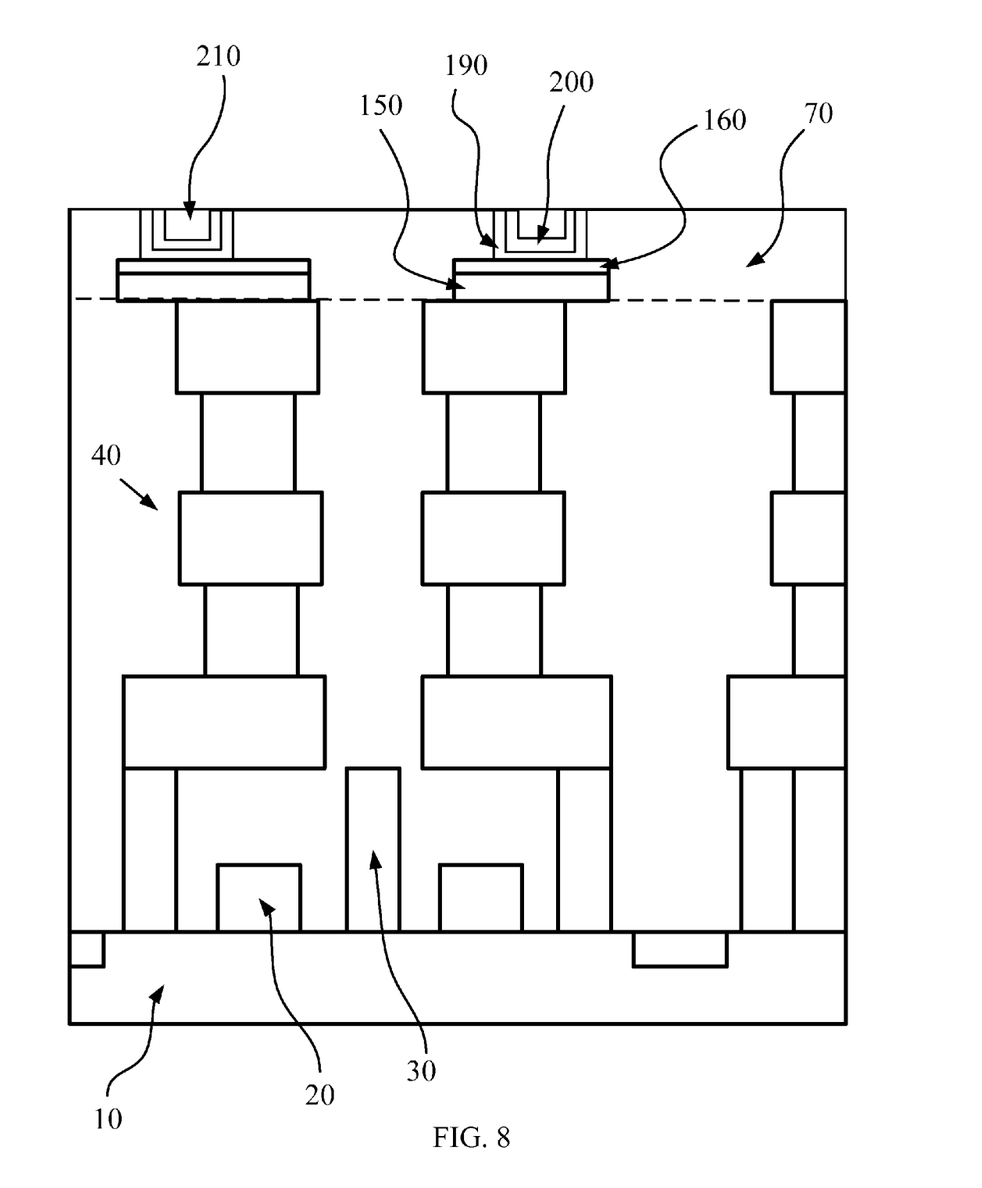
FIG. 8 is a schematic cross-sectional view of an STT-MRAM bit cell.

Next, the exemplary method removes portions of the tunneling barrier 190, free layer 200, and top electrode 210 that are disposed above the holes 180, for example, by polishing (e.g., chemical mechanical polishing (CMP)). As shown in FIG. 8, an STT MRAM bit cell having an MTJ storage element is formed.

The exemplary embodiments beneficially allow the number of photomasks used in a process to be reduced. For example, two photo masks can be used instead of three masks. Also, according to the embodiments, a heavy metal etch process is not needed for critical dimensions. Further, sidewall polymer stringer induced leakage pass can be reduced or eliminated.

Additionally, according to the embodiments, the tunneling barrier of the MTJ is not exposed to an ash and clean process. Moreover, the embodiments can provide a larger bottom fixed layer as compared with the conventional methods, which can minimize the stray field impact of the bottom fixed layer to the top free layer.

Figure 9:
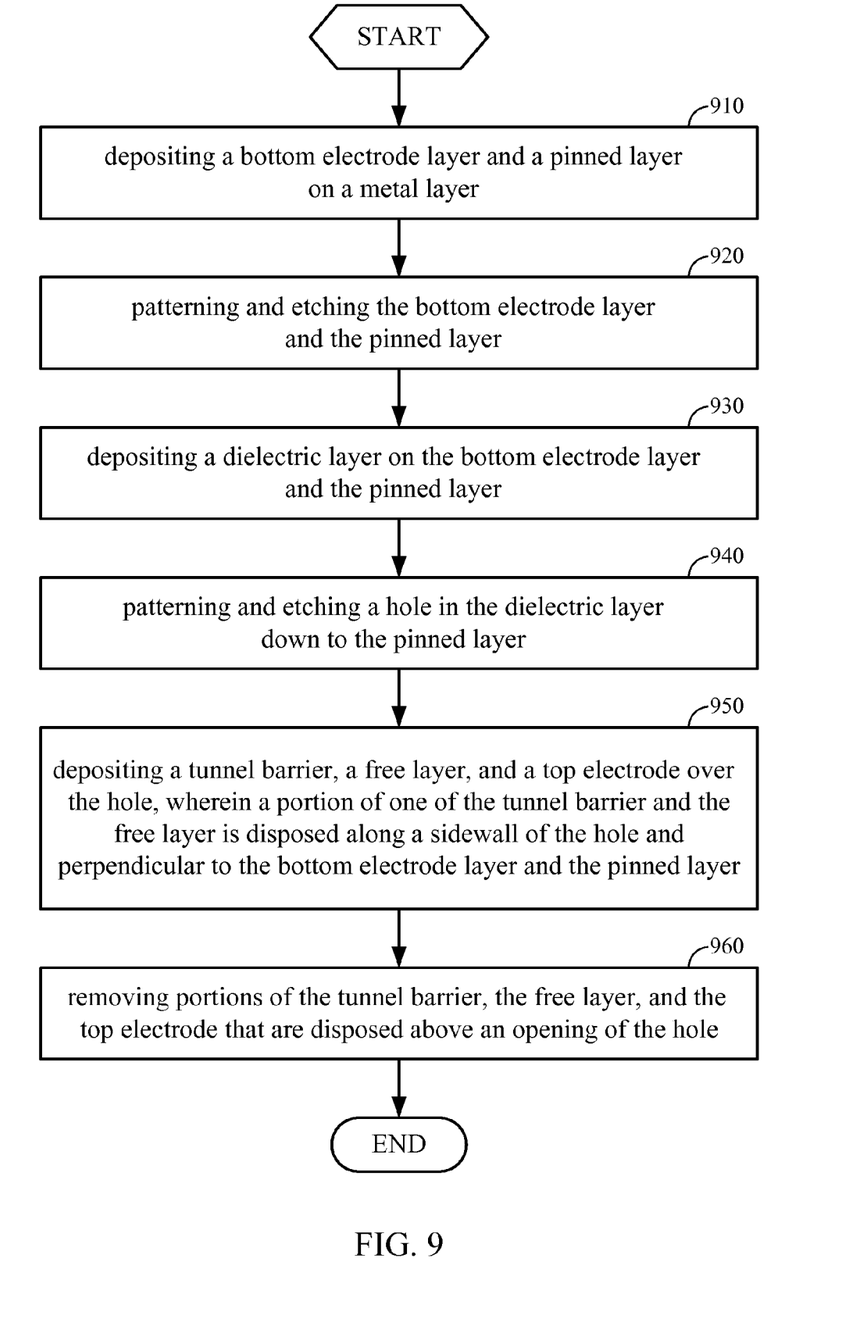
FIG. 9 is a flowchart showing an exemplary method of forming an STT-MRAM bit cell.

FIG. 9 is a flowchart showing an exemplary method of forming an STT-MRAM bit cell according to an embodiment. The method includes depositing a bottom electrode layer and a pinned layer on a metal layer (e.g., 910) and patterning and etching the bottom electrode layer and the pinned layer to form a bottom electrode of the MTJ storage element (e.g., 920). Next, the method includes depositing a dielectric layer on the bottom electrode layer and the pinned layer (e.g., 930) and patterning and etching a hole in the dielectric layer down to the pinned layer (e.g., 940). The method further includes depositing a tunneling barrier, a free layer, and a top electrode over the hole, wherein a portion of one of the tunneling barrier and the free layer is disposed along a sidewall of the hole and perpendicular to the bottom electrode layer and the pinned layer (e.g., 950). Additionally, the method includes removing portions of the tunneling barrier, the free layer, and the top electrode that are disposed above an opening of the hole (e.g., 960).

According to the exemplary method, an isolated MTJ storage element can be provided. As explained above, the exemplary embodiments beneficially allow the number of photomasks used in a process to be reduced. For example, two photo masks can be used instead of three masks. Also, according to the exemplary embodiments, a heavy metal etch process is not needed for critical dimensions. Further, sidewall polymer stringer induced leakage pass can be reduced or eliminated.

Additionally, according to the embodiments, the tunneling barrier of the MTJ is not exposed to an ash and clean process. Moreover, the embodiments can provide a larger bottom fixed layer as compared with the conventional methods, which can minimize the stray field impact of the bottom fixed layer to the top free layer.

For example, as shown in FIG. 10, an embodiment of a magnetic tunnel junction (MTJ) storage element includes a bottom electrode layer 150 and a pinned layer 160 adjacent to (e.g., above or on) the bottom electrode layer 150. A dielectric layer 70 encapsulates a portion of the bottom electrode layer 150 and the pinned layer 160, wherein the dielectric layer 70 includes sidewalls that define a hole 180 (e.g., see FIG. 6) adjacent to a portion of the pinned layer 160 (e.g., above or exposing a portion of the pinned layer 160). A tunneling barrier 190 is adjacent to (e.g., above or on) the pinned layer 160. A free layer 200 is adjacent to (e.g., above or on) the tunnel layer 190. A top electrode 210 is adjacent to (e.g., above or on) the free layer 200.

As shown in the embodiment of FIG. 10, a dimension X1 of the bottom electrode layer 150 and/or pinned layer 160 can be greater than a dimension X2 of the contact area between the pinned layer 160 and the tunneling barrier 190, which allows for greater tolerance when patterning and etching the hole 180 into the ILD 70 for receiving the tunneling barrier 190, free layer 200, and top electrode 210. Also, as shown in FIG. 10, a portion of one of the tunneling barrier 190 and the free layer 200 is disposed along a sidewall of the hole 180 and perpendicular to the bottom electrode layer 150 and the pinned layer 160. The top electrode 210 fills a portion of the hole 180 adjacent to (e.g., above or on) the free layer 200.

Figure 11:
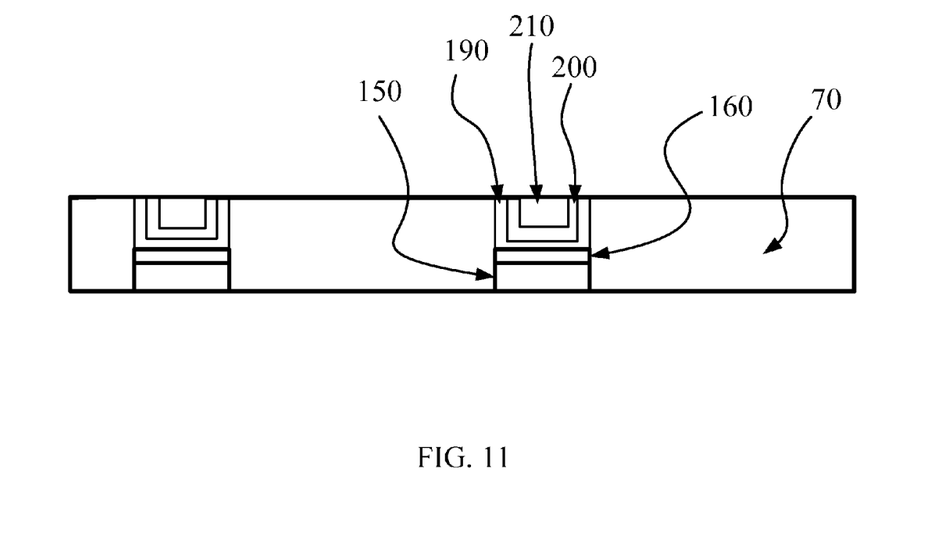
FIG. 11 is a schematic cross-sectional view of an MTJ storage element of an STT-MRAM bit cell.

One of ordinary skill in the art will recognize that, in other embodiments, the dimensions of the bottom electrode layer 150 and/or the pinned layer 160 can be equal to or less than the tunneling barrier 190, as exemplarily shown in FIG. 11. As shown in FIG. 11, a portion of one of the tunneling barrier 190 and the free layer 200 is disposed along a sidewall of the hole 180 and perpendicular to the bottom electrode layer 150 and the pinned layer 160. The top electrode 210 fills a portion of the hole 180 adjacent to (e.g., above or on) the free layer 200.

Figure 12:
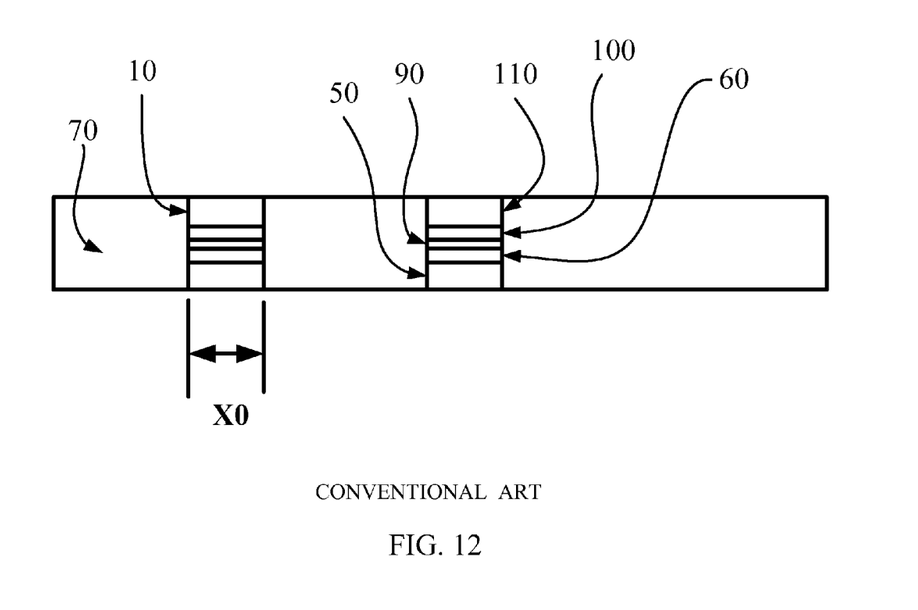
FIG. 12 is a schematic cross-sectional view of a MTJ storage element of an STT-MRAM bit cell.
Figure 13:
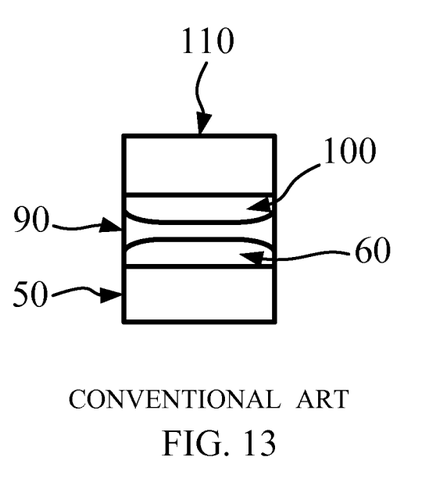
FIG. 13 is a schematic cross-sectional view of a MTJ storage element of an STT-MRAM bit cell.

In comparison, in the conventional MTJ storage element and method of forming the same, the bottom electrode layer 50, the pinned layer 60, the tunneling barrier layer 90, the free layer 100, and the top electrode 110 are subjected to patterning and etching, which results in each of the bottom electrode layer 50, the pinned layer 60, the tunneling barrier layer 90, the free layer 100, and the top electrode 110 having the same dimension X0, as shown in FIG. 12. Also, in the conventional MTJ storage element, the barrier oxide layer near the MTJ sidewall can be impacted by the process flow (i.e., the ash and clean process), thereby producing a thicker tunneling barrier 90 near the MTJ sidewall, as shown in FIG. 13. The impact of the thicker tunneling barrier 90 will be pronounced for scaled down features.

According to the exemplary method, an isolated MTJ storage element can be provided. As explained above, the exemplary embodiments beneficially allow the number of photomasks used in a process to be reduced. For example, two photo masks can be used instead of three masks. Also, according to the exemplary embodiments, a heavy metal etch process is not needed for critical dimensions. Further, sidewall polymer stringer induced leakage pass can be reduced or eliminated.

Additionally, according to the embodiments, the tunneling barrier of the MTJ is not exposed to an ash and clean process, thereby reducing or avoiding a thickening of the tunneling barrier near the sidewalls of the MTJ. Moreover, the embodiments can provide a larger bottom fixed layer as compared with the conventional methods, which can minimize the stray field impact of the bottom fixed layer to the top free layer.

It will be appreciated that memory devises including the MTJ storage elements described herein may be included within a mobile phone, portable computer, hand-held personal communication system (PCS) unit, portable data units such as personal data assistants (PDAs), GPS enabled devices, navigation devices, settop boxes, music players, video players, entertainment units, fixed location data units such as meter reading equipment, or any other device that stores or retrieves data or computer instructions, or any combination thereof. Accordingly, embodiments of the disclosure may be suitably employed in any device which includes active integrated circuitry including memory having MTJ storage elements as disclosed herein.

The foregoing disclosed devices and methods can be designed and can be configured into GDSII and GERBER computer files, stored on a computer readable media. These files are in turn provided to fabrication handlers who fabricate devices based on these files. The resulting products are semiconductor wafers that are then cut into semiconductor die and packaged into a semiconductor chip. The chips are then employed in devices described above.

Accordingly, embodiments can include machine-readable media or computer-readable media embodying instructions which when executed by a processor transform the processor and any other cooperating elements into a machine for performing the functionalities described herein as provided for by the instructions.

While the foregoing disclosure shows illustrative embodiments, it should be noted that various changes and modifications could be made herein without departing from the scope of the invention as defined by the appended claims. The functions, steps and/or actions of the method claims in accordance with the embodiments described herein need not be performed in any particular order. Furthermore, although elements of the embodiments may be described or claimed in the singular, the plural is contemplated unless limitation to the singular is explicitly stated.

What is claimed is:

1. A memory device having a magnetic tunnel junction (MTJ) storage element, the MTJ storage element comprising:
    a bottom electrode;
    a pinned layer adjacent to the bottom electrode;
    a dielectric layer encapsulating a portion of the bottom electrode and the pinned layer, wherein the dielectric layer includes sidewalls that define a hole adjacent to a portion of the pinned layer;
    a tunneling barrier adjacent to the pinned layer;
    a free layer adjacent to the tunneling barrier, wherein a portion of one of the tunneling barrier or the free layer is disposed along the sidewall of the hole and perpendicular to substantially all of the bottom electrode and substantially all of the pinned layer; and
    a top electrode adjacent to the free layer, wherein a width of the bottom electrode and/or the pinned layer in a first direction is greater than a width of a contact area between the pinned layer and the tunneling barrier in the first direction,
    wherein the tunneling barrier is in contact with the sidewalls of the dielectric layer, and
    wherein the free layer is not in contact with the sidewalls of the dielectric layer.

2. The memory device according to claim 1, wherein the top electrode fills a portion of the hole over the free layer.

3. The memory device according to claim 1,
    wherein the tunneling barrier has a U-shaped cross section with a first leg and a second leg, and
    wherein the first leg extends along the sidewall of the hole.

4. The memory device according to claim 3, wherein the free layer has a U-shaped cross section and is nested within the U-shaped cross section of the tunneling barrier.

5. The memory device according to claim 1, wherein the memory device is applied in an electronic device, selected from a group consisting of a set top box, music player, video player, entertainment unit, navigation device, communications device, personal digital assistant (PDA), fixed location data unit, and a computer, into which the memory device is integrated.

6. The memory device according to claim 1, wherein the memory device is a Spin Transfer Torque Magnetoresistive Random Access Memory (STT-MRAM).

7. The memory device according to claim 1, wherein the pinned layer is substantially flat in the first direction.

8. The memory device according to claim 1, wherein the pinned layer and the bottom electrode are substantially the same size in the first direction.

9. A memory device having a magnetic tunnel junction (MTJ) storage element, the MTJ storage element comprising:
    bottom conductive means for electrically connecting the MTJ storage element;
    first magnetic means for holding a first polarization, the first magnetic means being adjacent to the bottom conductive means;
    first insulating means for encapsulating a portion of the bottom conductive means and the first magnetic means, wherein the first insulating means includes sidewalls that define a hole adjacent to a portion of the first magnetic means;

second magnetic means for holding a second polarization, wherein the second polarization is reversible;

second insulating means for tunneling current flowing between the first magnetic means and the second magnetic means, the second insulating means separating the first magnetic means and the second magnetic means, wherein a portion of one of the second insulating means or the second magnetic means is disposed along the sidewall of the hole and perpendicular to substantially all of the bottom conductive means and substantially all of the first magnetic means; and top conductive means for electrically connecting the MTJ storage element, the top conductive means being adjacent to the second magnetic means, wherein a width of the bottom conductive means and/or the first magnetic means in a first direction is greater than a width of a contact area between the first magnetic means and the second insulating means in the first direction, wherein the second insulating means is in contact with the sidewalls of the first insulating means, and wherein the second magnetic means is not in contact with the sidewalls of the first insulating means.

10. The memory device according to claim 9, wherein the top conductive means fills a portion of the hole over the second magnetic means.

11. The memory device according to claim 9,
wherein the second insulating means has a U-shaped cross section with a first leg and a second leg, and
wherein the first leg extends along the sidewall of the hole.

12. The memory device according to claim 11, wherein the second magnetic means has a U-shaped cross section and is nested within the U-shaped cross section of the second insulating means.

13. The memory device according to claim 9, wherein the memory device is applied in an electronic device, selected from a group consisting of a set top box, music player, video player, entertainment unit, navigation device, communications device, personal digital assistant (PDA), fixed location data unit, and a computer, into which the memory device is integrated.

14. The memory device according to claim 9, wherein the memory device is a Spin Transfer Torque Magnetoresistive Random Access Memory (STT-MRAM).

15. A memory cell, comprising:
an interconnect; and
a magnetic tunnel junction (MTJ) storage element electrically coupled to the interconnect,
wherein the MTJ storage element comprises:
a bottom electrode above and in contact with the interconnect;
a pinned layer above and in contact with the bottom electrode;
a dielectric layer above the interconnect and encapsulating a portion of the bottom electrode and the pinned layer, wherein the dielectric layer includes sidewalls defining a hole above a portion of the pinned layer, and wherein a width of the hole is less than a width of the pinned layer;
a tunneling barrier within the hole and comprising:
a first tunneling barrier part above and in contact with the portion of the pinned layer exposed by the hole, and
a second tunneling barrier part adjacent to and in contact with the sidewalls of the dielectric layer;
a free layer within the hole and comprising:
a first free layer part over and in contact with the first tunneling barrier part, and
a second free layer part adjacent to and in contact with the second tunneling barrier part; and
a top electrode within the hole and in contact with the first free layer part and the second free layer part.

16. The memory cell according to claim 15, wherein the bottom electrode and the interconnect are offset relative to each other such that a portion of the bottom electrode is not in contact with the interconnect and a portion of the interconnect is not in contact with the bottom electrode.

17. The memory cell according to claim 15, wherein the free layer is not in contact with the sidewalls of the dielectric layer.

* * * * *